(12) United States Patent
Cole

(10) Patent No.: US 7,884,311 B2
(45) Date of Patent: Feb. 8, 2011

(54) IMAGING DEVICES HAVING A LAYER OF PIXEL COMPONENT MATERIAL WITH DISCRETE CONSTRUCTS FOR OPERATING ELECTRICAL PIXEL COMPONENTS AND METHODS OF FORMING THE SAME

(75) Inventor: Bryan G. Cole, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 55 days.

(21) Appl. No.: 12/425,771

(22) Filed: Apr. 17, 2009

(65) Prior Publication Data

US 2009/0200628 A1 Aug. 13, 2009

Related U.S. Application Data

(62) Division of application No. 11/148,554, filed on Jun. 9, 2005, now Pat. No. 7,534,982.

(51) Int. Cl.
*H01L 27/00* (2006.01)
(52) U.S. Cl. ................... 250/208.1; 250/214 R
(58) Field of Classification Search .......... 250/208.1, 250/214 R, 214.1, 239, 226; 257/80–85, 257/223, 230–233, 432–435; 348/272, 308
See application file for complete search history.

(56) References Cited

U.S. PATENT DOCUMENTS

| 4,001,878 | A | | 1/1977 | Weimer |
| 5,514,887 | A | | 5/1996 | Hokari |
| 5,990,988 | A | * | 11/1999 | Hanihara et al. ............ 349/48 |
| 6,140,630 | A | | 10/2000 | Rhodes |
| 6,204,524 | B1 | | 3/2001 | Rhodes |
| 6,310,366 | B1 | | 10/2001 | Rhodes et al. |
| 6,326,652 | B1 | | 12/2001 | Rhodes |
| 6,333,205 | B1 | | 12/2001 | Rhodes |
| 6,376,868 | B1 | | 4/2002 | Rhodes |
| 2002/0022298 | A1 | | 2/2002 | Lin |
| 2003/0087486 | A1 | | 5/2003 | Laurin et al. |
| 2004/0012029 | A1 | | 1/2004 | Bawolek et al. |
| 2004/0178467 | A1 | | 9/2004 | Lyon et al. |

FOREIGN PATENT DOCUMENTS

JP 2000-150846 5/2000

OTHER PUBLICATIONS

Nixon et al., "256×256 CMOS Active Pixel Sensor Camera-on-a-Chip", IEEE Journal of Solid State Circuits, vol. 31 (12); pp. 2046-2050, (1996).
Mendis et al., "CMOS Active Pixel Image Sensors", IEEE Transactions on Electron Devices, vol. 41(3), pp. 452-453 (1994).
Wong et al., "CMOS Active Pixel Image Sensors Fabricated Using a 1.8V, 0.25 MUM CMOS Technology", International Electron Devices Meeting 1996, Technical Digest, IEDM 96, San Francisco, Dec. 8-11, 1996, pp. 915-918.

* cited by examiner

*Primary Examiner*—Que T Le
(74) *Attorney, Agent, or Firm*—Dickstein Shapiro LLP

(57) ABSTRACT

Methods and structures to reduce the occurrence of crosstalk and pixel noise in solid state imager arrays. In an exemplary embodiment, a section of a layer patterned to form polysilicon buried-contacts in the pixel structure is also patterned to be disposed over the active, photosensor portion of the pixel. The section of the buried-contact layer covering the photosensor portion of the pixel serves to filter the light striking the buried-contact layer before the light strikes the photosensor. The polysilicon light filter reduces the amount of stray light entering from the adjacent pixels without adding significant processing complexity.

18 Claims, 7 Drawing Sheets

IMAGING DEVICES HAVING A LAYER OF PIXEL COMPONENT MATERIAL WITH DISCRETE CONSTRUCTS FOR OPERATING ELECTRICAL PIXEL COMPONENTS AND METHODS OF FORMING THE SAME

This application is a divisional of application Ser. No. 11/148,554, filed Jun. 9, 2005, now U.S. Pat. No. 7,534,982 which is hereby incorporated by reference in its entirety.

FIELD OF THE INVENTION

This invention generally relates to the field of light shielding of imaging device pixels.

BACKGROUND OF THE INVENTION

Solid state imaging devices can include an optoelectronic converter that transduces light energy received, through an optical lens, into electrical energy. The optoelectronic converter is typically arranged in an array of pixels. Each pixel features a discrete photosensor that converts a respective portion of the received light signal into an electrical signal. The electrical signals produced by each photosensor are processed by pixel and other circuitry to render a digital image representing the source from which the light energy was received.

Ideally, light received by each photosensor travels directly from the source being imaged, through a pixel surface facing the light stimulus, and strikes the photosensor. In reality, however, light entering the optoelectronic converter is scattered by reflection and refraction by pixel structures. Consequently, an individual photosensor can receive stray light, such as light that is intended for neighboring photosensors in the array. This stray light, referred to as optical "crosstalk," reduces the quality and accuracy of the rendered image. The problems associated with optical crosstalk become increasingly more evident as imagers become smaller and array pixel densities increase.

Optical crosstalk is particularly problematic in color imagers, in which each pixel assumes a specialized light-detecting role. The photosensor in a typical pixel is sensitive to a wide spectrum of light energy. Consequently, an array of typical pixels provides a black-and-white imager. Color filters can be used to limit the wavelengths of the light that strikes the photosensors. In color imagers, color filter mosaic arrays (CFAs) are arranged in the light paths to the photosensors to impart color-sensitivity to the imager. In most cases a three-color red-green-blue (RGB) pattern is used, although other patterns exist: three-color complementary YeMaCy, or mixed primary/complementary colors, and four-color systems where the fourth color is white or a color with shifted spectral sensitivity. The CFAs are arranged in a pattern, with the Bayer pattern being the predominate arrangement used. The result is an imager capable of rendering color images in the visible light spectrum.

Ideally, each photosensor will receive only those wavelengths of light which the photosensor is intended to convert. In reality, however, optical crosstalk between the pixels allows light directed to the blue color filter, for example, to strike a red color pixel, causing the red color pixel to register more red light than is actually present in the image being viewed. A similar problem occurs with green light striking a blue pixel, red on green, etc. In addition, CFA imperfections will allow additional crosstalk in the form of some blue and green light entering red pixels, and red light entering blue and green pixels, for example. These various types of crosstalk reduce the accuracy of the images produced.

Another problem, particularly in CMOS imagers, is known commonly as "pixel noise." Certain types of pixel noise are produced due to differing physical and electrical properties of the various components contained in adjoining layers and regions of the pixel device-structure. For example, mis-matched material-interfaces can become areas that "trap" electrons or holes. A silicon dioxide/silicon interface, for example, can include such "trap-sites." Interfaces that involve substances having a higher silicon density than the substrate create a higher likelihood of "trap-sites" along the boundaries, particularly as compared to the silicon/gate oxide interface of a transistor, for example. Trap-sites also can result from defects along silicon dioxide/silicon-interfaces between the layer or region boundaries, as well as dangling bonds or broken bonds along the silicon dioxide/silicon interface, which can trap electrons or holes.

The trap-sites typically are uncharged, but become energetic by trapped electrons or holes. Highly-energetic electrons or holes are called "hot-carriers." Hot-carriers can get trapped in the available trap-sites, and contribute to the fixed charge of the device and change the threshold voltage and other electrical characteristics of the device. Current generation from trap-sites inside or near a photosensor contributes to dark current (i.e., electrical current present in the photosensor in the absence of light) in CMOS imagers due to constant charge leaking into the photosensor. Dark current is detrimental to the operation and performance of a photosensor. Accordingly, it is desirable to provide an isolation technique that prevents pixel noise in the form of current generation or current leakage, for example.

CMOS imagers of the type discussed above are generally known. CMOS imagers are discussed, for example, in Nixon et al., "256×256 CMOS Active Pixel Sensor Camera-on-a-Chip," IEEE Journal of Solid-State Circuits, Vol. 31(12), pp. 2046-2050 (1996); Mendis et al., "CMOS Active Pixel Image Sensors," IEEE Transactions on Electron Devices, Vol. 41(3), pp. 452-453 (1994); U.S. Pat. Nos. 6,140,630; 6,376,868; 6,310,366; 6,326,652; 6,204,524 and 6,333,205, the entire disclosures of which are incorporated herein by reference.

There is a need to reduce optical crosstalk and pixel noise in solid state imagers. Particularly advantageous solutions would provide improved light filtering without additional costs or processing steps, and potentially would reduce the number and extent of steps or components used in the manufacturing process. Methods and structures that reduce optical crosstalk, and improve color filter capabilities, will improve imaging system sensitivity and accuracy.

BRIEF SUMMARY OF THE INVENTION

The present invention provides methods and structures to reduce the occurrence of crosstalk and pixel noise in solid state imager arrays. In an exemplary embodiment, a section of a layer patterned to form polysilicon buried-contacts in the pixel structure is also patterned to be disposed over the active, photosensor portion of the pixel. The section of the buried-contact layer covering the photosensor portion of the pixel serves to filter the light striking the buried-contact layer before the light strikes the photosensor. The polysilicon light filter reduces the amount of stray light entering from the adjacent pixels without adding significant processing complexity.

BRIEF DESCRIPTION OF THE DRAWINGS

The above and other advantages and features of the invention will be more clearly understood from the following detailed description which is provided in connection with the accompanying drawings, in which.

DETAILED DESCRIPTION OF THE INVENTION

Figure 1:
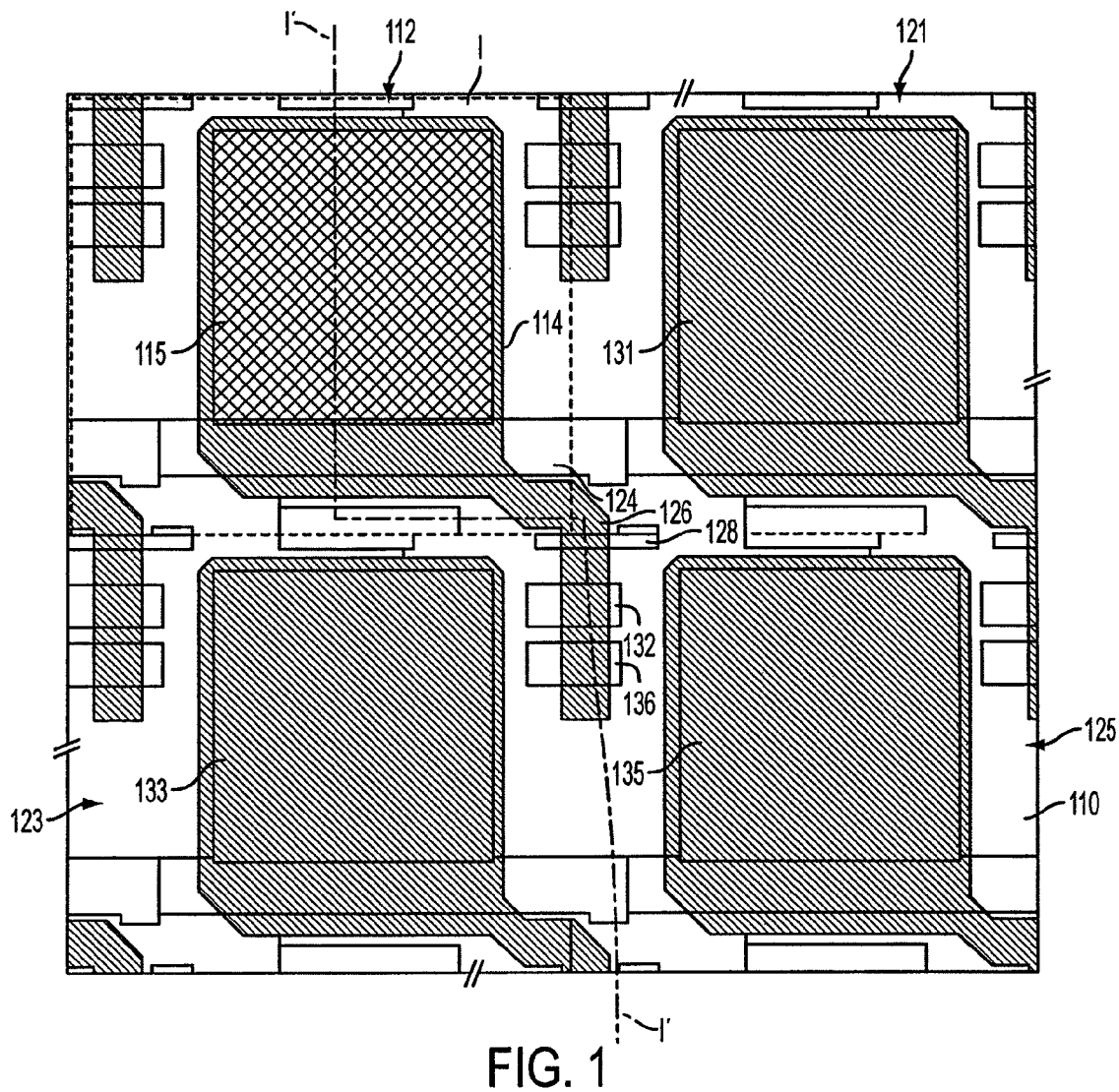
FIG. 1 illustrates an exemplary pixel layout according to an embodiment of the invention.

In the following detailed description, reference is made to the accompanying drawings which form a part hereof, and in which is shown by way of illustration of specific embodiments by which the invention may be practiced. It should be understood that like reference numerals represent like elements throughout the drawings. These exemplary embodiments are described in sufficient detail to enable those skilled in the art to practice the invention. It is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on other semiconductors, for example, silicon-germanium, germanium, or gallium arsenide.

The term "pixel" refers to a picture element unit cell containing circuitry including a photosensor and semiconductors for converting electromagnetic radiation to an electrical signal. For purposes of illustration, fabrication of a representative pixel is shown and described. Typically, fabrication of all pixels in an imager will proceed simultaneously in a similar fashion. The following detailed description is, therefore, not to be taken in a limiting sense, and the scope of the present invention is defined by the appended claims.

The invention relates to a method and structures which provide a patterned conductive layer, such as a polysilicon buried contact layer, as a light filter. The buried contact layer, which forms the buried contact and the polysilicon light filter, is deposited on the same surface as the pixel transistor layer of the CMOS imager. The CMOS integrated circuit is fabricated using standard CMOS processes.

Broadly described, polysilicon, from which buried contacts in the pixel transistor circuitry will be developed, is deposited on a major surface of an imaging device undergoing fabrication. The polysilicon is then patterned and unused portions removed. Remaining portions are left to be used as buried contacts. A remainder of the polysilicon is also left in place (not removed) to cover active areas for light shielding purposes. The polysilicon light filter may be left in place over all color pixels or only those sensitive to a particular color of light, such as red-colored light. The polysilicon filters provide additional depth for photons to penetrate which can be used to filter adjacent pixel optical cross talk. The filter is particularly useful to absorb light in the blue and green wavelengths to provide purer red light to the photosensor, though it is not limited to red pixels. An additional layer or layers can be formed to cover the polysilicon layer.

Polysilicon, applied as a blanket deposition during the manufacturing process, can be selectively removed from certain areas to form buried contacts for interconnecting elements of a pixel circuit. Normally, the polysilicon is not applied over the photosensors to prevent light blockage of the photosensors, and is applied to avoid shorting or otherwise interfering with the active area and other conductive structures.

At the same time, without additional process steps, the polysilicon blanket layer used to form the buried contact may also be patterned to remain over all, or only over selected colors of the photosensors to provide light blockage and reduced optical crosstalk. The polysilicon layer used for the buried contact may be patterned to remain over all or only particular color pixels, for example those sensitive to red-colored light. Other light-blocking structures formerly provided in layers at a further distance from the photosensor surface, may be eliminated or reduced in thickness. In addition, with the polysilicon layer in place over layer areas of the pixel array, a more planar deposition surface is provided, thereby potentially eliminating or abbreviating subsequent polishing steps, for example, of layers deposited over the polysilicon light filter.

One advance of a n-type polysilicon light filter is that surface noise is reduced by the placement of a polysilicon lattice on a PN junction. Carriers from dangling bonds will be captured in the depletion region and swept away before they can enter the photodiode. One advantage of a p-type buried contact is that a better ground connection may be created with the p+ portion of the photodiode, however, this advantage requires a contact to ground somewhere on the polysilicon light filter. The better ground connection prevents an unwanted potential from building up on the polysilicon light filter.

An exemplary embodiment of the invention is described below in connection with CMOS imaging circuitry and components. The circuit described below includes a photodiode, serving as a photosensor, for accumulating photo-generated charge in an underlying portion of the substrate. It should be understood, however, that the imager may include a photogate or other photosensitive image-to-charge converting devices, in lieu of a photodiode, and that the invention is not limited by the type of photo-generated charge accumulator. Also the invention is not limited to use in CMOS image sensors, but may be used in other semiconductor image sensors as well.

Referring more specifically now to the drawings, FIG. 1 shows, in top down view, an exemplary embodiment of a four transistor (4T) CMOS pixel 112 using a photodiode 114 as a photoconversion device according to the present invention. FIG. 1 illustrates a four pixel view of a color filter array. The photodiode 114 is formed in a p-type substrate 110. A polysilicon light filter 115 is shown covering the photodiode 114. The pixel of FIG. 1, indicated by dashed box I is the only pixel of FIG. 1 having the polysilicon filter 115 (as indicated by the cross hatching), is part of a row-and-column array of pixels used for imaging.

Figure 2:
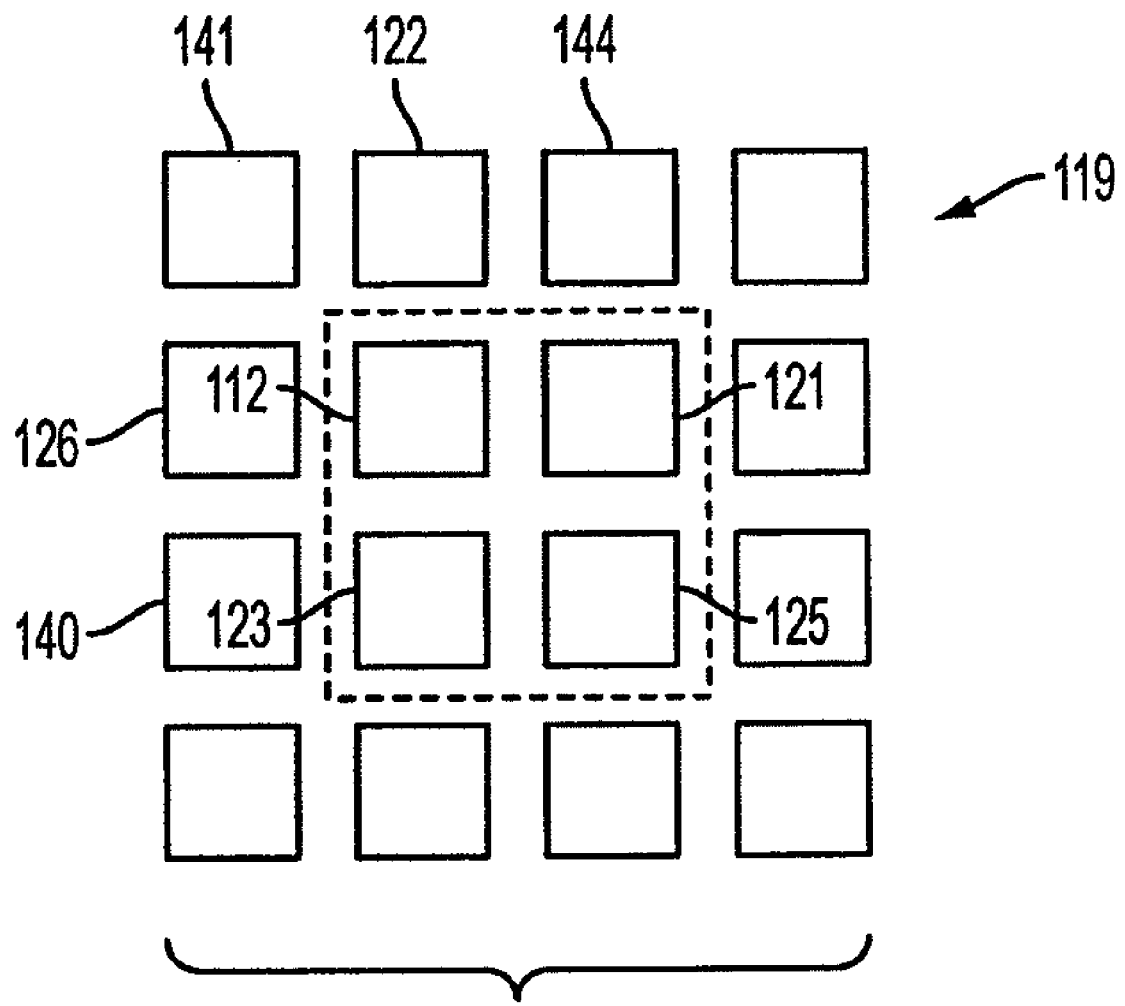
FIG. 2 illustrates an exemplary color filter mosaic array arranged in a Bayer pattern.

The four-pixel section of FIG. 1 is shown within dashed box II in FIG. 2. The four-by-four pixel section is a representation of the Bayer color filter array. Each red pixel 112 is surrounded by green and blue pixels. Directly adjacent the red-colored pixel 112 are green-colored pixels 121, 122, 123, 126. The remaining surrounding pixels are pixels 125, 140, 141, 144 sensitive to blue-colored light. The pattern of one red, two green, and one blue-colored pixel, illustrated in dashed box I is repeated to produce the mosaic color filter array 119. Other color filter patterns can be used within the teachings of the invention.

Referring to FIG. 1, pixels 121, 123, 125 do not have a polysilicon layer 115 covering their respective photodiodes 131, 133, 135. According to the exemplary illustrated embodiment, the polysilicon material used for the buried contacts absorbs most of the light in the blue and green wavelength ranges. Thus, the polysilicon buried contact layer 115 is formed to cover the photodiode 114 of the red-colored pixel 112 only. The polysilicon buried contact material is removed from covering the photodiodes 131, 133 of the green-colored pixels 121, 123, and the photodiode 135 of the blue-colored pixel 125. FIG. 1 also illustrates floating diffusion region 126, transistor gate 132, transfer gate 124, reset gate 128 and row select gate 136 which are discussed further below. Fabrication of an exemplifying embodiment of the present invention is described further below.

Figure 3:
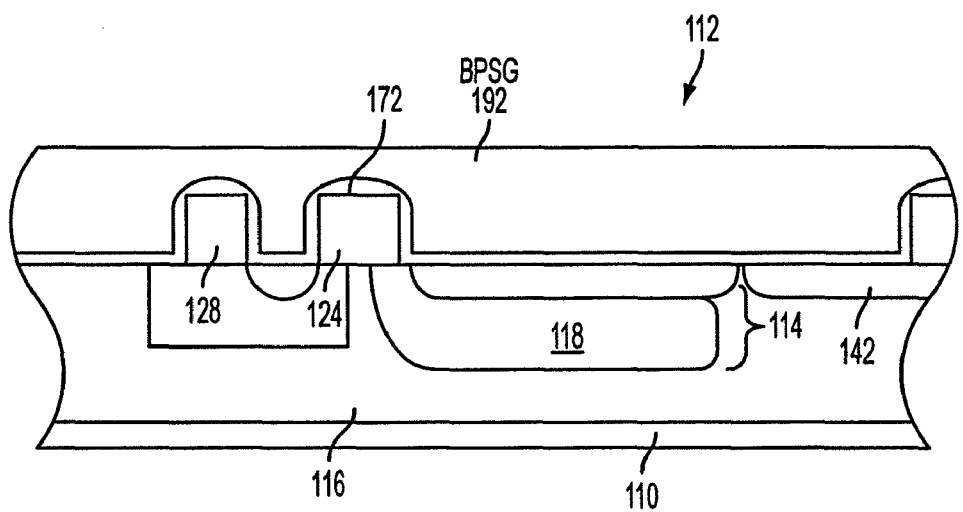
FIG. 3 illustrates a partial cross section of a pixel during a fabrication step according to an exemplary embodiment of the present invention.

Referring to FIG. 3, a pixel undergoing an interim stage of fabrication is shown, in cross-section, along the dashed line I'-I' of FIG. 1. Only the portion of the cross section relevant to the description of the invention is shown. It should be understood that while FIGS. 3-6 illustrate the structure of a single pixel 112, in practical use there will be an M×N array of pixels, including pixel 112 and other similar pixels, arranged in rows and columns. A portion of such an array is represented in FIGS. 1 and 2. The pixels in the array will be fabricated simultaneously on a common substrate. Individual pixels in the array are accessed using row and column select circuitry, as is known in the art and described further below. Lateral isolation between pixels is provided by shallow trench isolation regions 142.

The 4T CMOS pixel 112 as shown in FIGS. 3-6 is formed partially in and over the doped p-type epitaxial region 116 provided over the semiconductor substrate 110, and includes the photodiode 114, a transfer gate 124, and a reset gate 128. The photodiode includes a photo collection region 118 and surface layer 120. A source follower gate 132 and a row select gate 136 are shown in the schematic diagram of FIG. 7.

Figure 7:
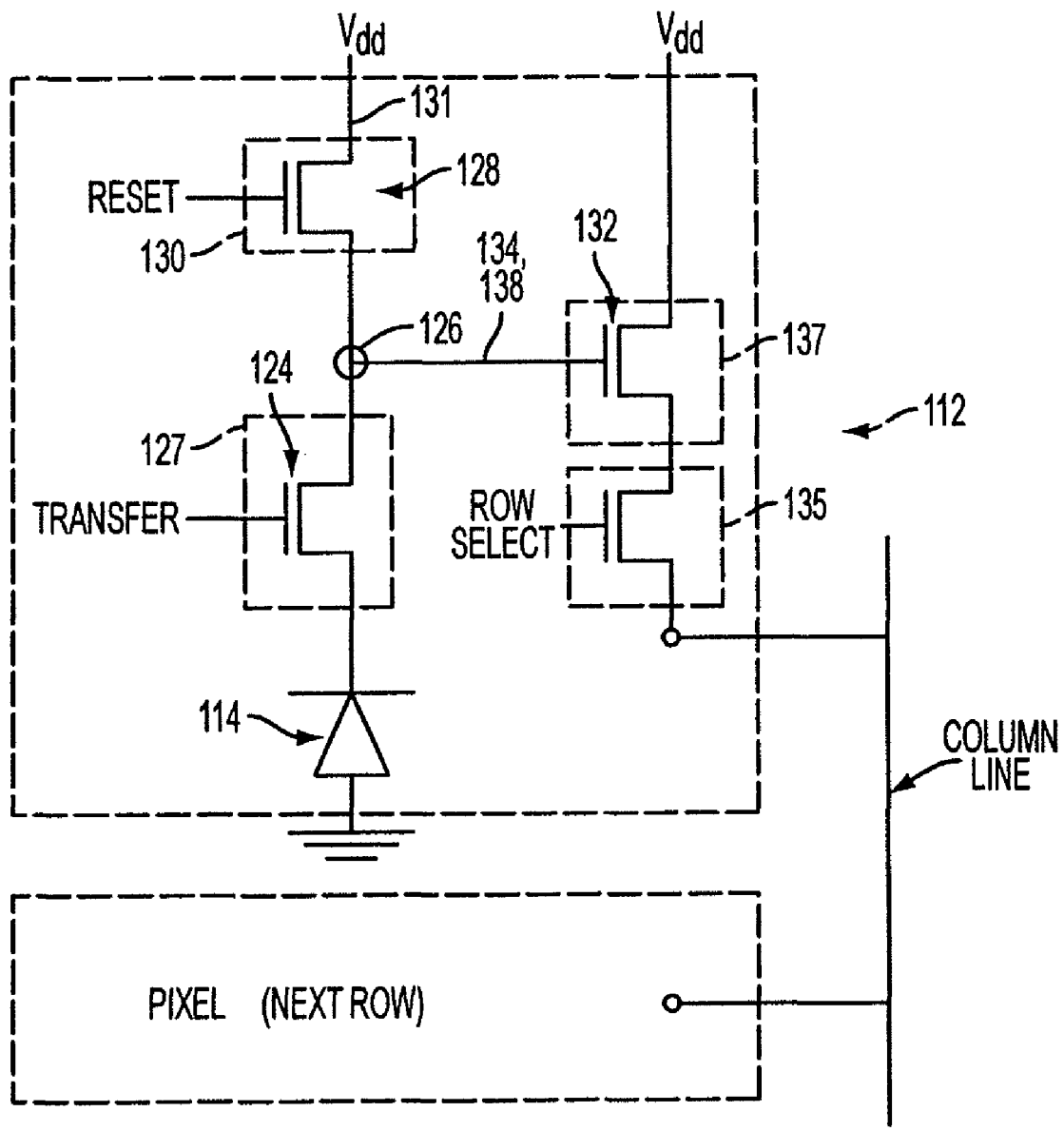
FIG. 7 schematically illustrates an electrical circuit of an exemplary pixel according to the present invention.

Referring further to FIG. 7, the transfer gate 124 forms part of a transfer transistor 127 for electrically gating charges accumulated by photodiode 114 to a floating diffusion region 126. A first conductor 134 at the floating diffusion region 126 is in electrical communication with the gate 132 of the source follower transistor 137 through a second conductor 138, connected by a conductive path in a conductive interconnect layer. Sharing the floating diffusion region 126 with the transfer transistor 127 is a reset transistor 130 having a reset gate 128. The reset transistor 130 is connected to a voltage source ($V_{dd}$) through a source/drain region having a conductor 131 providing a resetting voltage to the floating diffusion region 126.

Figure 4:
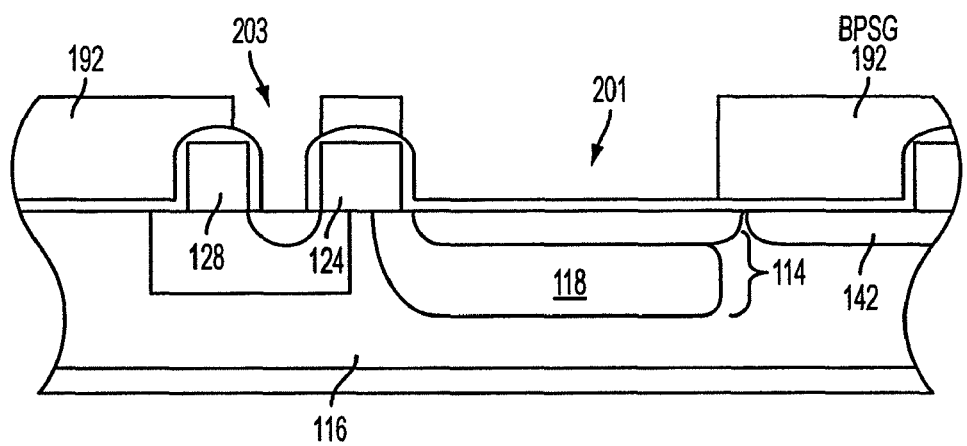
FIG. 4 illustrates a partial cross section of a pixel during a fabrication step, subsequent to the FIG. 3 step, according to an exemplary embodiment of the present invention.

Referring again to FIG. 3, an insulating layer 172 is formed over the surface and a blanket of BPSG 192 is deposited over the insulating layer 172. The insulating layer 172 may be formed of TEOS or gate oxide. The BPSG 192 is patterned and etched to form buried contact holes 201, 203, as shown in FIG. 4. The insulating layer 172 is also etched away in the area of the holes 201, 203. Advantageously, the BPSG layer 192 is etched away from the photodiode 114 active area, to allow filling of the hole 201 with a polysilicon material that will provide light shielding (discussed below).

Figure 5:
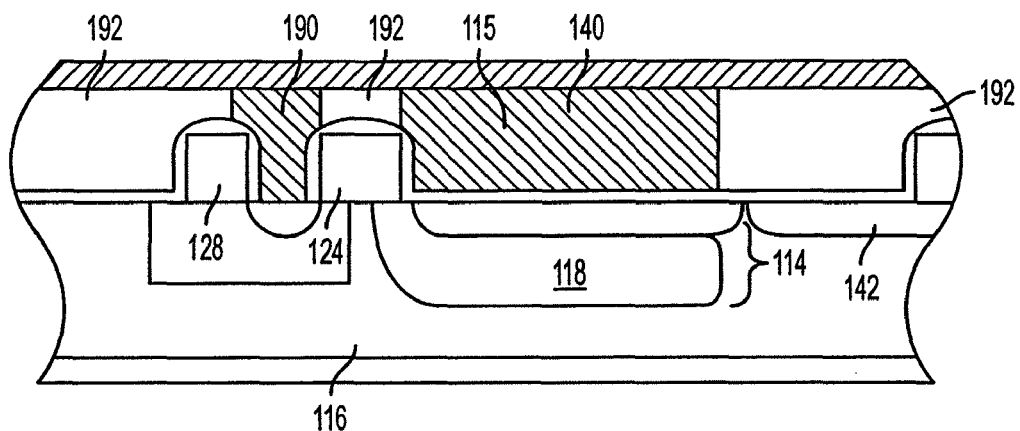
FIG. 5 illustrates a partial cross section of a pixel during a fabrication step, subsequent to the FIG. 4 step, according to an exemplary embodiment of the present invention.
Figure 6:
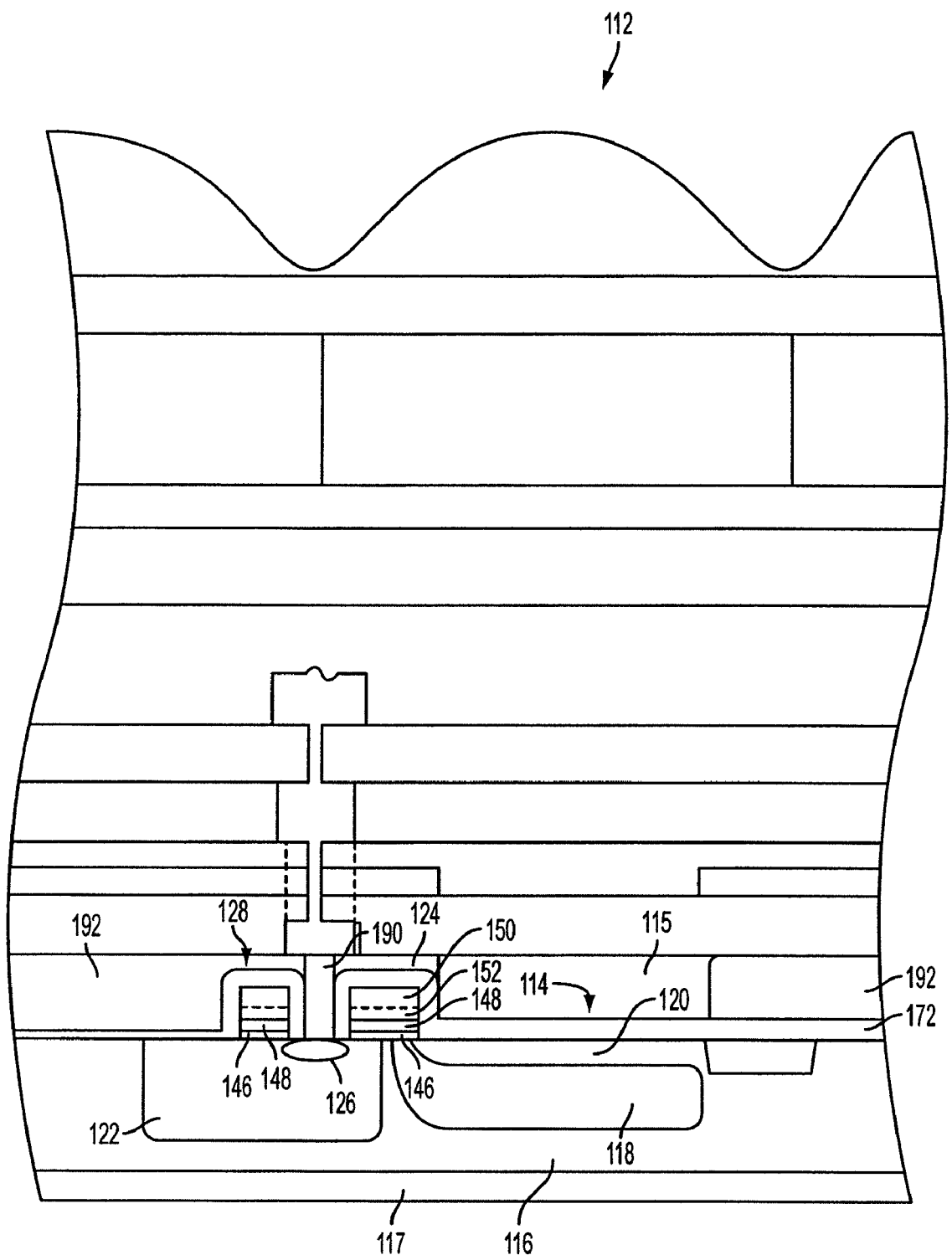
FIG. 6 illustrates in elevation a cross section of a portion of an imager array according to an exemplary embodiment of the present invention.

After the buried contact holes 201, 203 are formed, a polysilicon layer 140 is deposited, as shown in FIG. 5. Polysilicon layer 140 is etched and/or polished, for example, to leave patterned buried contacts 190 and the light filter 115 covering photodiode 114. Light shielding for photodiode 114 is provided by light absorption in polysilicon light filter 115. The pixel arrays of the present invention described with reference to FIGS. 3-5 may be further processed as known in the art to arrive at CMOS imagers representative of those discussed with reference to FIGS. 1-5, and having the buried contact and the polysilicon light filter of the present invention, as shown in FIG. 6.

The amount of light absorbed in 1600 Å polysilicon is significantly higher for light of blue and green wavelengths than for light of visible red wavelengths. The energy bandgap ($E_G$) of silicon is 1.11 eV at 300° K, or a wavelength ($\lambda_G$) of 1117.8 nm. Photons with a wavelength $\lambda$ less than $\lambda_G$ are absorbed by the electrons in the polysilicon lattice. Statistically, red light ($\lambda$=600-750 nm) penetrates the deepest before becoming absorbed. Green light ($\lambda$=500-600 nm) penetrates less, while blue light ($\lambda$=400-500 nm) is quickly absorbed. Polysilicon will absorb about five times more light than crystal silicon.

Absorption is defined as the relative decrease of irradiance $\Phi$ per unit path length:

$$\delta\Phi(x)/\Phi = \alpha\delta x \qquad \text{Eq. 1}$$

A solution to this equation is:

$$\Phi(x) = \Phi_O e^{-\alpha x} \qquad \text{Eq. 2}$$

where $\Phi_O$ is the incident irradiance, $\alpha$ is the absorption coefficient, and x is path length.

The absorption coefficient of polysilicon was determined experimentally by Lubberts et al., "Optical Properties of Phosphorus-doped Polycrystalline Silicon Layers," J. Appl. Phys. 52, 6870-6878 (November 1981), results of which are shown in Table I:

TABLE I

| Wavelength (μm) | α undoped (×10E4 cm$^{-1}$) |
| --- | --- |
| 0.4 | 22.7 |
| 0.45 | 8.33 |
| 0.5 | 3.7 |
| 0.55 | 1.84 |
| 0.6 | 0.981 |

The results shown in Table I reveal that light of longer wavelength (e.g., red colored light) will be absorbed less (i.e., have a lower absorption coefficient α) than light of shorter wavelength (e.g., green colored and blue colored light). A substantial majority of light shielding is provided by light absorption in the polysilicon layer 140. Although the invention has particular utility for blocking light to red pixels, it may be used with other color pixels as well to tailor the light absorption characteristics of the pixels.

The polysilicon light filter 115 may be a non-electrically active layer. Alternatively it may be desirable to ground or slightly bias the polysilicon light filter 115. A bias applied to the filter 115 is useful to prevent a build up of unwanted dark current.

Referring again to FIG. 7, the representative pixel 112 is operated as known in the art by RESET, TRANSFER, and ROW SELECT control signals. The 4T circuit 112 can be converted to a three transistor (3T) circuit by removing the transfer transistor, and electrically coupling the photodiode 114 output to the floating diffusion region 126, the floating diffusion region 126 being connected to the source follower gate 132 of the source follower transistor 137.

Figure 8:
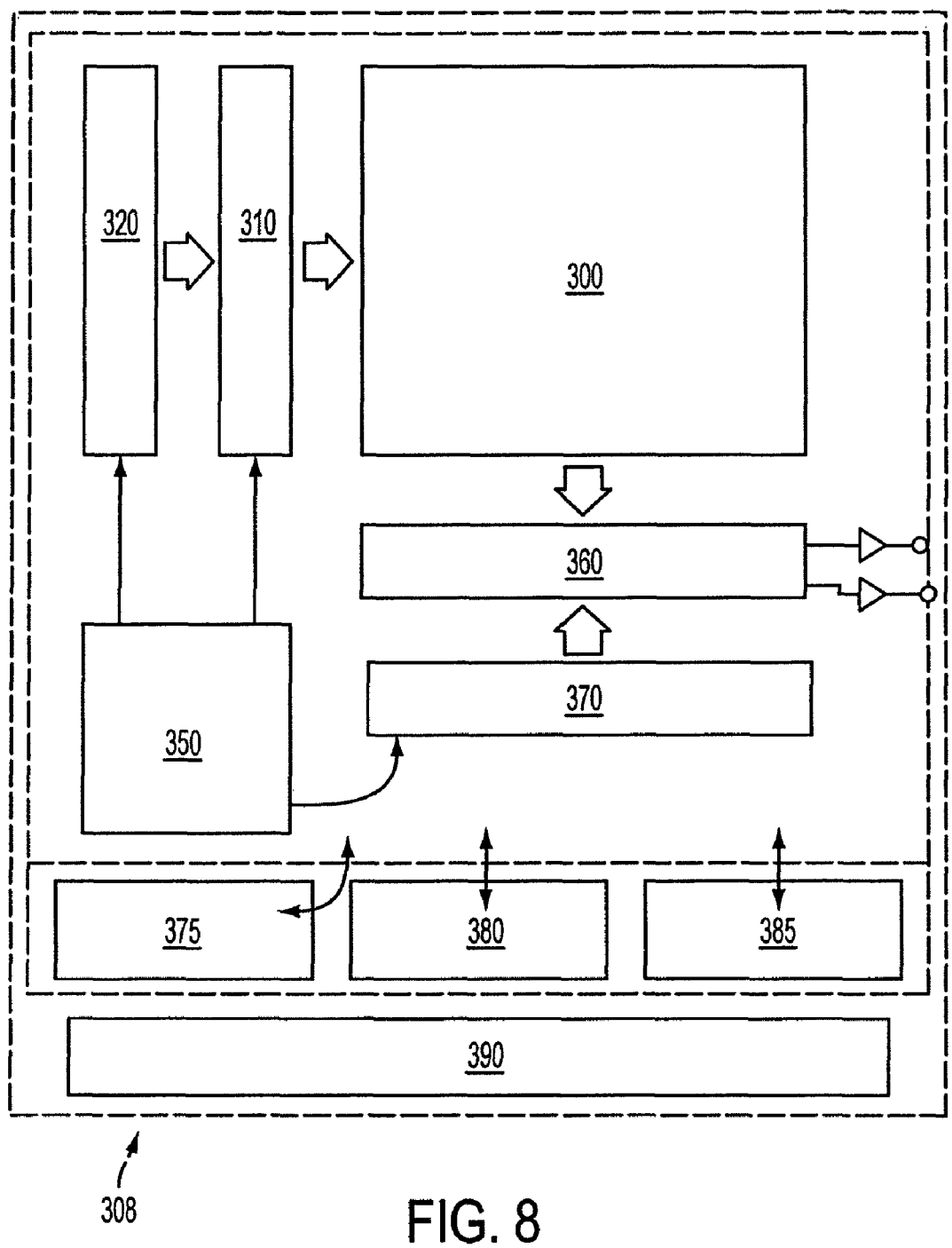
FIG. 8 illustrates a block diagram of an imaging device including an array of imager pixels as illustrated in FIGS. 1-7.

FIG. 8 illustrates a block diagram for a CMOS imaging device 308 having a pixel array 300 incorporating pixels 112 constructed in the manner discussed above in relation to FIGS. 1-7. Pixel array 300 comprises a plurality of pixels 112 arranged in a predetermined number of columns and rows. The pixels 112 of each row in pixel array 300 can all be turned on at the same time by a row select line and the pixels 112 of each column are selectively output by a column select line. A plurality of row and column lines are provided for the entire pixel array 300. The row lines are selectively activated by the row driver 310 in response to row address decoder 320 and the column select lines are selectively activated by the column driver 360 in response to column address decoder 370. Thus, a row and column address is provided for each pixel 112.

The CMOS imaging device 308 is operated by the control circuit 350, which controls address decoders 320, 370 for selecting the appropriate row and column lines for pixel readout, and row and column driver circuits 310, 360 which apply driving voltage to the drive transistors of the selected row and column lines. A memory 375, e.g., an SRAM, can be in communication with the pixel array 300 and control circuit 350. A serializer module 380 and SFR (Special Function Register) device 385 can each be in communication with the control circuit 300. Optionally, a localized power source 390 can be incorporated into the imaging device 308.

Typically, the signal flow in the imaging device 308 would begin at the pixel array 300 upon its receiving photo-input and generating a charge. The signal is output to a read-out circuit and then to an analog-to-digital conversion device. The signal is then transferred to a processor, then the serializer, and then the signal can be output from the imaging device to external hardware.

Figure 9:
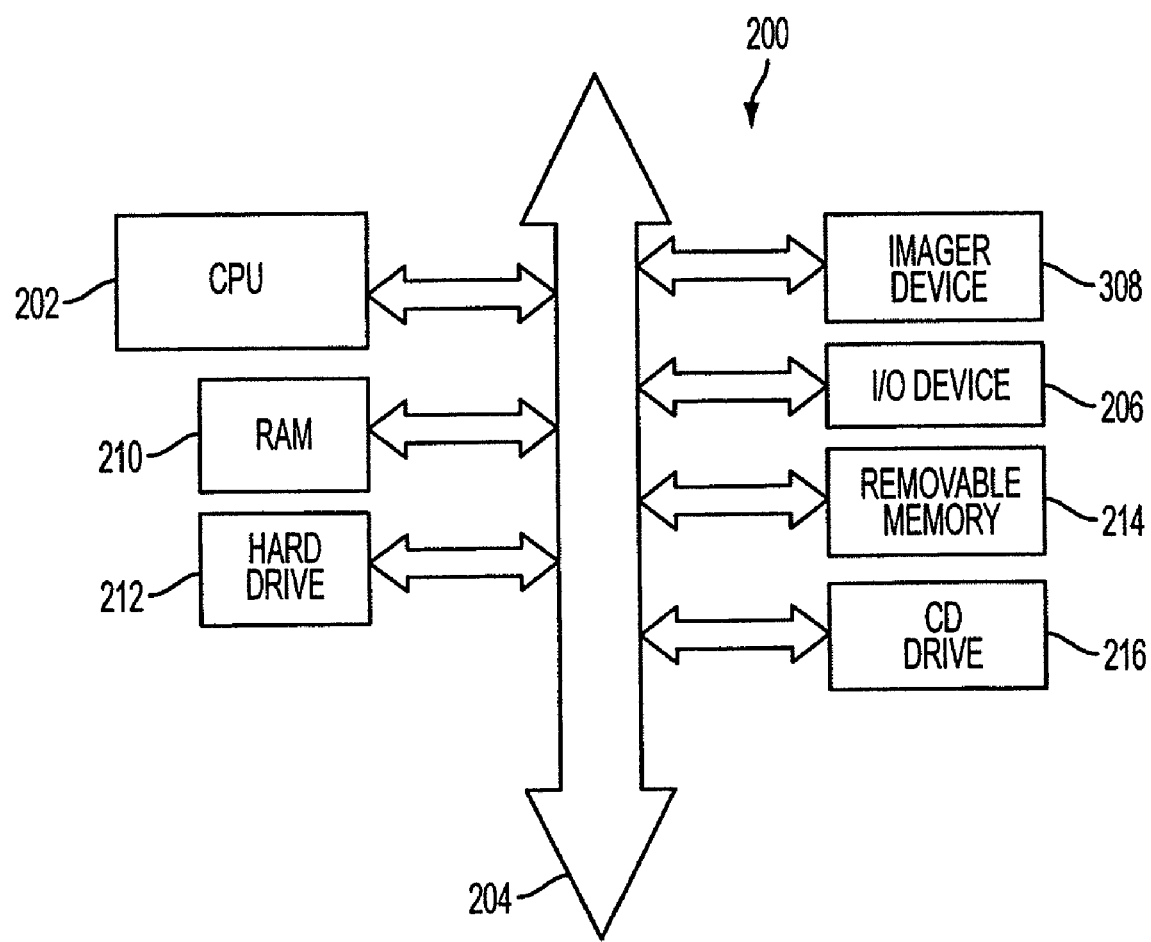
FIG. 9 illustrates a processor system incorporating at least one CMOS imager in accordance with the present invention.

FIG. 9 shows system 200, a typical processor based system modified to include an imaging device 308 as an input device for the system 200. The imaging device 308 may also receive control or other data from the system 200 as well. Examples of processor based systems, which may employ the imaging device 308, include, without limitation, computer systems, camera systems, scanners, machine vision systems, vehicle navigation systems, video telephones, surveillance systems, auto focus systems, star tracker systems, motion detection systems, image stabilization systems, and others.

System 200 includes a central processing unit (CPU) 202 that communicates with various devices over a bus 204. Some of the devices connected to the bus 204 provide communication into and out of the system 200, illustratively including an input/output (I/O) device 206 and imaging device 308. Other devices connected to the bus 204 provide memory, illustratively including a random access memory (RAM) 210 and one or more removable memory devices 214, such as a floppy disk drives, compact disk (CD) drives, flash memory cards, etc. The imaging device 308 may be combined with a processor, such as a CPU, digital signal processor, or microprocessor, in a single integrated circuit.

The processes and devices described above illustrate exemplary methods and devices out of many that could be used and produced according to the present invention. The above description and drawings illustrate exemplary embodiments which achieve the objects, features, and advantages of the present invention. It is not intended, however, that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. An imaging device comprising:
   photosensors supported by a substrate;
   a layer of pixel component material supported by the substrate, the pixel component material being patterned to comprise discrete constructs for operating electrical pixel components; and
   a layer, formed on the same planar level as said layer of pixel component material, covering a plurality of the photosensors configured to function as a light filter.

2. An imaging device as in claim 1, wherein said pixel component layer further comprises an insulating layer covering the layer of pixel component material.

3. An imaging device as in claim 2, wherein the insulating layer is TEOS.

4. An imaging device as in claim 1, wherein the light filter layer is formed over red pixels.

5. A CMOS imager comprising:
   an array of imager pixels arranged in rows and columns on a substrate, each imager pixel comprising:
   a photoactive region;
   a fabrication layer supported by the substrate comprising pixel circuitry; and
   a light-filtering region, formed on the same planar level as said fabrication layer, arranged and configured to cover the photoactive region and absorb incident light.

6. The CMOS imager of claim 5, further comprising a buried contact formed in said fabrication layer.

7. The CMOS imager of claim 6, wherein said buried contact and said light-filtering region are formed of the same polysilicon layer.

8. The CMOS imager of claim 5, further comprising a colored light filter layer formed above said photoactive region and said light-filtering region.

9. The CMOS imager of claim 8, wherein the colored light filter layer is red.

10. The CMOS imager of claim 5, wherein said light filtering region is formed over red photoactive regions.

11. The CMOS imager of claim 5, wherein said light filtering region is formed of polysilicon.

12. A method of forming a pixel of an imaging device, comprising:
   forming a photosensor in a substrate;
   forming a first layer on the substrate;

patterning the first layer to remove portions of the first layer to provide circuitry arranged to operate the pixel;

forming a light filtering layer over the photosensor; and forming a color filter over said photosensor and said light filtering layer for further light filtering.

13. A method of forming a CMOS imager pixel array, comprising:

arranging a plurality of CMOS imager pixels in rows and columns on a substrate, the CMOS imager pixels each being formed by:

providing a photosensor supported by the substrate;

forming a first conductive layer supported by the substrate comprising gate structures connected in a circuit to operate the photosensor;

forming a second conductive layer being arranged to cover at least part of the photosensor to block light from entering the photosensor; and forming a color filter over said second conductive layer.

14. The method of claim 13, further comprising the act of patterning an insulating layer before forming the second conductive layer.

15. The method of claim 13, wherein the step of forming said color filters comprises arranging red, green and blue colored filters over said pixels.

16. The method of claim 15, wherein said second conductive layer is formed over red pixel cells.

17. The method of claim 13, wherein said second conductive layer is formed over a plurality of said pixels.

18. The method of claim 13, wherein the step of forming said second conductive layer further comprises forming a buried contact coincidently with said portion covering said photosensor.

* * * * *